US 008860218 B2

(12) United States Patent
Abdul Razak

(10) Patent No.: US 8,860,218 B2
(45) Date of Patent: Oct. 14, 2014

(54) SEMICONDUCTOR DEVICE HAVING IMPROVED CONTACT STRUCTURE

(75) Inventor: Ramlah Binte Abdul Razak, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 157 days.

(21) Appl. No.: 13/269,938

(22) Filed: Oct. 10, 2011

(65) Prior Publication Data

US 2013/0087909 A1    Apr. 11, 2013

(51) Int. Cl.
*H01L 23/48* (2006.01)
*H01L 23/00* (2006.01)

(52) U.S. Cl.
CPC ......... *H01L 24/06* (2013.01); *H01L 2924/3511* (2013.01); *H01L 224/81191* (2013.01); *H01L 24/05* (2013.01); *H01L 2224/0616* (2013.01); *H01L 2224/1703* (2013.01); *H01L 24/14* (2013.01); *H01L 2224/16238* (2013.01); *H01L 2224/0401* (2013.01); *H01L 2224/05022* (2013.01); *H01L 2224/1403* (2013.01); *H01L 2224/16227* (2013.01); *H01L 2924/15311* (2013.01); *H01L 2224/05555* (2013.01); *H01L 2224/81815* (2013.01); *H01L 224/0603* (2013.01); *H01L 2224/05572* (2013.01); *H01L 2224/09104* (2013.01); *H01L 24/13* (2013.01); *H01L 24/16* (2013.01)
USPC ..................... 257/738; 257/737; 257/E23.068

(58) Field of Classification Search
CPC ................. H01L 2924/00014; H01L 2924/00; H01L 2224/13111; H01L 2924/014; H01L 2924/01047; H01L 2924/01029; H01L 2224/13099; H01L 2924/00013; H01L 2924/01082; H01L 2224/32225; H01L 2224/131
USPC .......................... 257/734, 737, 738, E23.068
See application file for complete search history.

(56) References Cited

U.S. PATENT DOCUMENTS

| | | | | |
|---|---|---|---|---|
| 5,985,694 A * | 11/1999 | Cho | ............................... | 438/108 |
| 6,348,401 B1 * | 2/2002 | Chen et al. | .................... | 438/617 |
| 6,415,974 B2 * | 7/2002 | Jao | ................. | 228/215 |
| 7,569,471 B2 | 8/2009 | Pang et al. | | |
| 2005/0179131 A1 * | 8/2005 | Homma | ........................ | 257/737 |
| 2007/0069346 A1 * | 3/2007 | Lin et al. | ....................... | 257/673 |
| 2008/0081458 A1 * | 4/2008 | Lin et al. | ....................... | 438/620 |
| 2008/0182120 A1 | 7/2008 | Tan et al. | | |
| 2009/0189286 A1 * | 7/2009 | Daubenspeck et al. | ........ | 257/762 |
| 2010/0044872 A1 | 2/2010 | Park et al. | | |

FOREIGN PATENT DOCUMENTS

JP        6188286        12/1992

\* cited by examiner

*Primary Examiner* — Duy T Nguyen
(74) *Attorney, Agent, or Firm* — Steven A. Shaw; Frederick J. Telecky, Jr.

(57) ABSTRACT

A semiconductor die includes a first contact stack including a first die pad having a first pad perimeter, a first via through a dielectric layer to the first die pad having a first via perimeter, and a first UBM pad contacting the first die pad through the first via having a first UBM pad perimeter. A second contact stack includes a second die pad having a second pad perimeter shorter than the first pad perimeter, a second via through the dielectric layer to the second die pad having a second via perimeter shorter than the first via perimeter, and a second UBM pad contacting the second die pad through the second via having a second UBM pad perimeter that is shorter than the first UBM pad perimeter.

10 Claims, 4 Drawing Sheets

US 8,860,218 B2

SEMICONDUCTOR DEVICE HAVING IMPROVED CONTACT STRUCTURE

FIELD

Disclosed embodiments relate to semiconductor integrated circuit (IC) die having different solder bump sizes.

BACKGROUND

Conventional semiconductor IC die utilize metal die pads for receiving and supplying signals to and from other circuitry. The die pad is usually in a rectangular shape, wherein some of the metal layers are utilized for carrying signals between the die pads and other circuitry of the IC chip. Conductive lines formed from one or more of the metal layers connect the die pads to nodes in the circuitry.

One method of die assembly utilizes solder bumped die that are flip chip assembled onto a workpiece. Flip chip interconnections provide short electrical connecting paths as compared to wire bonds, and therefore better electrical performance including speed. Conventional semiconductor die for flip chip applications have a single bump size including a single bump height and a single bump diameter that that are formed over die pads of a single fixed size.

The flip-chip die size in many IC design is limited by the size of the solder pads and the pad pitch, the number of input/output (I/O) pins, and the current density limitation of each solder pad. Uniform die pad size of the minimum pitch often necessitates multiple die pads for each high current (e.g., power supply terminal) terminal due to electromigration (EM) considerations, since a single minimum size die pad may fail the EM rule for high current terminals in some circuit designs. There is thus a bottleneck that limits the reduction of flip chip die size because of the solder pad design constraint.

SUMMARY

Disclosed embodiments recognize a large solder bump size alone does not solve the electromigration (EM) problem for high current pins, such as power supply pins, without a enlarged die pad under the UBM pad and a larger area in between the die pad and the UBM pad. As disclosed herein, the semiconductor die size can be reduced while enabling reliable device performance and a reduction in die size by combining multiple small die pads that were necessary to divide the current flowing to or from a single metal line for EM considerations for conventional circuit designs into a larger die pad, while other die pads (such as connected to signal nodes/pins) on the semiconductor die are kept smaller. Enlarged area die pads, vias and UBM pads are used for larger solder bumps, while smaller area die pads, vias and UBM pads can be used for the smaller solder bumps.

Disclosed embodiments include semiconductor die that include a first contact stack including a first die pad having a first pad perimeter, a first via through a dielectric layer to the first die pad having a first via perimeter, and a first UBM pad contacting the first die pad through the first via having a first UBM pad perimeter. A second contact stack includes a second die pad having a second pad perimeter shorter than the first pad perimeter, a second via through the dielectric layer to the second die pad having a second via perimeter shorter than the first via perimeter, and a second UBM pad contacting the second die pad through the second via having a second via perimeter shorter than the first via perimeter.

DETAILED DESCRIPTION

Figure 1A:
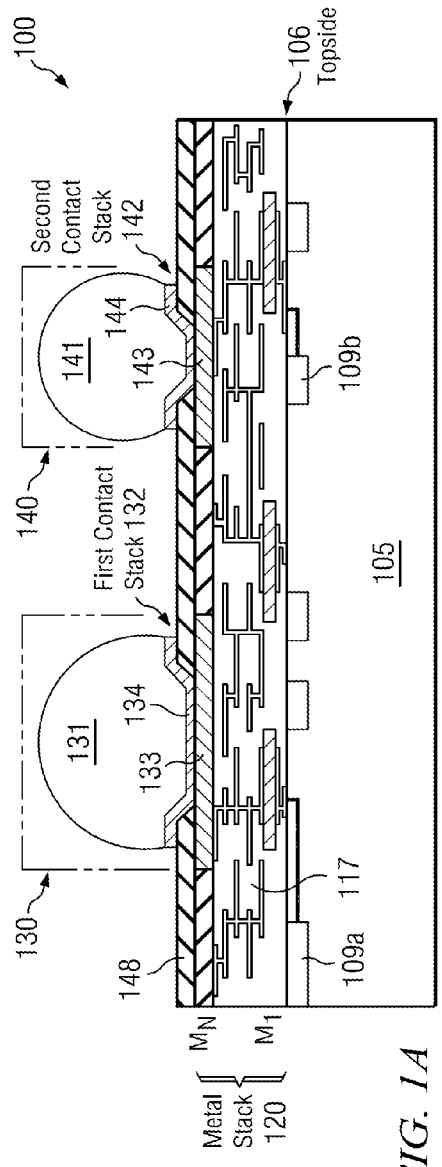
FIG. 1A is a cross sectional depiction of an example semiconductor die having an improved contact structure that is configured for flip chip assembly, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1A is a cross sectional depiction of an example semiconductor die 100 having an improved contact structure configured for flip chip assembly, according to an example embodiment. Semiconductor die 100 includes solder bumps having both smaller size second solder bumps (e.g., smaller bump diameters) 141 and larger size first solder bumps 131 (e.g., larger bump diameters and thus larger solder volumes). All solder bumps have essentially the same bump height when measured from the topside surface 106 of the semiconductor die 100. For convenience, the larger/enlarged area contact stacks are referred herein to as first contact stacks that include larger area (and thus larger perimeter) die pads, larger vias and larger UBM pads that include larger solder bumps that can be used for power supply connections, while smaller area (and thus smaller perimeter) contact stacks are referred to herein as second contact stacks include smaller area die pads, smaller area vias and smaller UBM pads that can be used for the smaller solder bumps that can be used for typical signal node connections.

Semiconductor die 100 is adapted for assembly to a substrate/workpiece that has a single bonding level (e.g., single metal-level (ML) substrate having a single plane of metal (e.g., copper) land pads), such as the substrate 230 shown in FIG. 2A described below. FIG. 1C is a top view depiction of the semiconductor die shown in FIG. 1A with the respective solder bumps 131 and 141 removed to reveal the features of the respective contact stacks 132 and 142.

Semiconductor die 100 comprises a substrate 105 having a topside surface 106. The topside surface 106 includes circuit elements comprising active circuitry shown with active circuitry blocks 109a and 109b identified therein. The circuit elements on the topside surface 106 of semiconductor die 100 are configured to provide an IC function. Example circuit functions include those to implement digital signal processors (DSP's), data converters, and integrated power semiconductor devices such as power regulators, amplifiers and preamplifiers, and functions to support other IC applications. The substrate 105 can comprise a variety of different substrate materials, such as silicon, and silicon-germanium, for example.

Semiconductor die 100 includes a back end of the line (BEOL) ML metal stack 120 on the topside surface 106 comprising M1 (first level metal) and Mn (top level metal) having inter-level dielectric layers 117 between the respective metal layers. Although not referenced specifically in FIGS. 1A and 1B, there can be seen to be plurality of intermediate metal layers, such as M2, M3, and M4, . . . having inter-level dielectric 117 between the respective metal layers. A passivation layer 148 comprising a dielectric material is over the ML metal stack 120. Mn provides a plurality of die pads including the first die pad 133 and second die pad 143 shown. Mn can comprise metal including copper or aluminum, such as an aluminum copper alloy. Although the respective metal layers M1 to Mn are all generally approximately the same thickness, the intermediate metal levels between M1 to Mn in FIGS. 1A, 1B, 2A and 2B are all shown thinned considerably to compress the size of these figures.

The passivation layer 148 has vias (see vias 139 and 149 in FIG. 1C, described below) that expose first die pad 133 and second die pad 143 to allow direct coupling thereto by first and second UBM pads 134 and 144, respectively. There is no redistribution layer (RDL) between the UBM pads 134, 144 and the die pads 133, 143.

Semiconductor die 100 is shown including a first flip chip bonding feature 130 comprising a first solder bump 131 on a first contact stack 132, and a second flip chip bonding feature 140 comprising a second solder bump 141 on a second contact stack 142. A node/pin within active circuitry 109a is shown coupled to first die pad 133, and a node/pin within active circuitry 109b is shown coupled to second die pad 143. The node within active circuitry 109a can be a high current node such as a power supply (e.g., VCC/VEE) node or high current signal nodes, while the node within active circuitry 109b shown coupled to second die pad 143 can be a lower current node, such as a typical signal node. One particular example of a high current node signal node (as opposed to a power supply node) comprises writer pins on preamplifier ICs for hard disk drive (HDD) applications.

The first contact stack 132 includes a first die pad 133 having a first pad perimeter length (see perimeter 133a shown in FIG. 1C). A first via 139 is through the passivation layer 148 to the first die pad 133 that has a first via perimeter (see via perimeter 149a shown in FIG. 1C). Passivation layer 148 can comprise various dielectrics, such as a polyimide, benzocyclobutene (BCB) or silicon nitride.

A first UBM pad 134 directly contacts the first die pad 133 through first via 139 in the passivation layer 148 having a first UBM pad perimeter length 134a. Disclosed UBM pads such as first UBM pad 134 can comprise one or more layers as known in the art. The second contact stack 142 includes a second die pad 143 having a second pad perimeter 143a that is shorter than the first pad perimeter 133a, and a second via 149 through passivation layer 148 to the second die pad 143 having a second via perimeter 149a that is shorter than the first via perimeter 139a. The second UBM pad 144 directly contacts the second die pad 143 through the second via 149.

Semiconductor die 100 is seen to feature enlarged respective areas and perimeters for the components of the first contact stack 132 as compared to the respective areas and perimeters for the components of the second contact stack 142. Specifically, semiconductor die 100 provides the first contact stack 132 comprising an enlarged first die pad 133 under an enlarged first UBM pad 134, and an enlarged via between the first die pad 133 and the first UBM pad 134, as compared to the respective sizes of the second contact stack 142 comprising second die pad 143 under the second UBM pad 144, and the second via 149 between the second die pad 143 and the second UBM pad 144.

Semiconductor die 100 is configured to pass a first current through the combination of the first die pad 133, first via 139 and the first UBM pad 134 with a current density that is below the predetermined threshold current density per perimeter length (e.g., based on industry standard value based on the respective material compositions) at the first pad perimeter 133a, at the first via perimeter 139a, and at the first UBM pad perimeter 134a, that if passed through the combination of the second die pad 143, the second via 149, and the second UBM pad 144 would have exceeded the predetermined threshold current density per perimeter length at the second pad perimeter 143a, the second via perimeter 149a, and at the second UBM pad perimeter 144a.

Figure 1B:
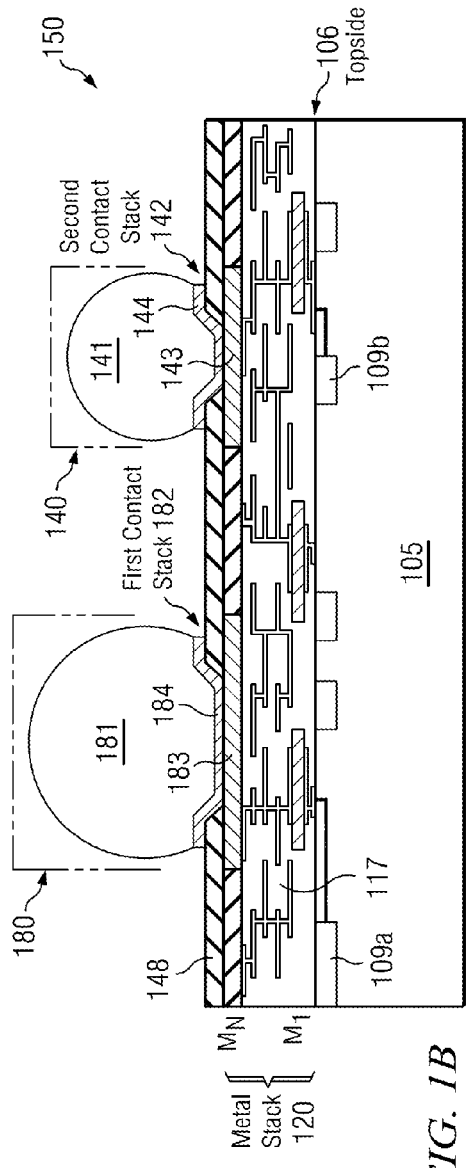
FIG. 1B is a cross sectional depiction of an example semiconductor die having an improved contact structure that is configured for flip chip assembly, according to another example embodiment.
Figure 1C:
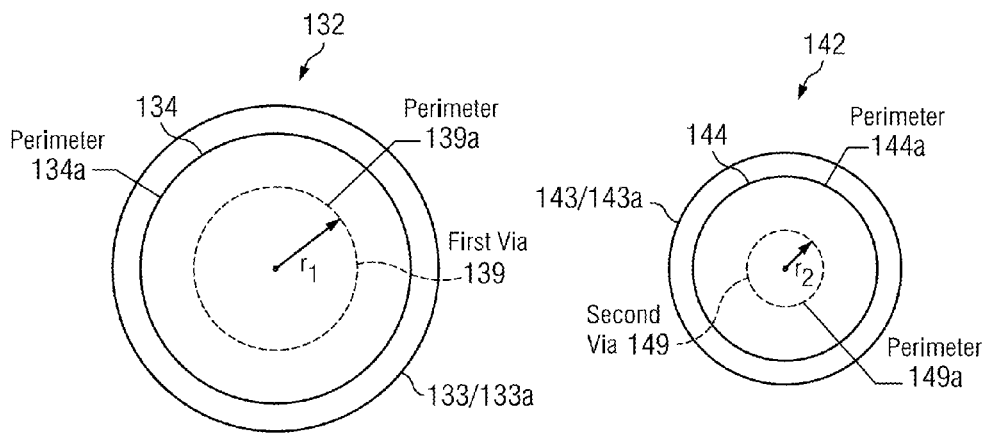
FIG. 1C is a top view depiction of the semiconductor die shown in FIG. 1A with the respective solder bumps removed to reveal the features of the respective contact stacks.

FIG. 1B is a cross sectional depiction of an example semiconductor die 150 having an improved contact structure configured for flip chip assembly, according to another example embodiment. Semiconductor die 150 includes solder bumps having the second contact structure 142 shown in FIG. 1A including the smaller size solder bumps 141, and a first contact structure 180 including larger size solder bumps 181, where the larger size solder bump 181 has a taller bump height as compared to second solder bump 141 when measured from the topside surface of the semiconductor die 100, as well a larger diameter. This embodiment is adapted for assembly to a substrate/workpiece that has multiple bonding levels (e.g. a 2 ML substrate that has a first and a second plane of metal (e.g., copper) land pads, such as shown in FIG. 2B).

First contact stack 182 is shown including a first die pad 183 having a first pad perimeter length, with a via (analogous to first via 139 shown in FIG. 1C) through the passivation layer 148 to the first die pad 183 that has a first via perimeter length. A first UBM pad 184 directly contacts the first die pad 183 through a via (analogous to the first via 139 shown in FIG. 1C) in the passivation layer 148.

FIG. 1C is a top view depiction of semiconductor die 100 with the respective solder bumps 131 and 141 removed to reveal the features of the first contact stack 132 and the second contact stack 142. The first contact stack 132 is seen to include a first via 139 that provides an aperture through passivation layer 148 that allows first UBM pad 134 to directly contact the first die pad 133, while second contact stack 142 is seen to include a second via 149 that provides an aperture through passivation layer 148 that allows second UBM pad 144 to directly contact the second die pad 143. First die pad 133 has a first pad perimeter length 133a, and the second die pad 143 has a second pad perimeter length 143a.

The first via 139 has a first via perimeter length 139a that can be approximated as $2\pi r_1$ when the first via 139 is circular or nearly circular (e.g., octagon shaped), while the second via 149 has a second via perimeter length 149a that is equal to $2\pi r_2$ when second via is also circular or nearly circular. As shown, $r_1 \gg r_2$. Although the die pads 133 and 143, vias 139 and 149, and first and second UBM pads 134 and 144 are all shown as being circular in shape, the shapes for these features for disclosed embodiments can include a variety of other shapes, such as rectangular and octagon. The first contact stack 132 thus provides an enhanced area pad area (pad perimeter) not only on the UBM level, but also the die pad level that provides die pad 133 under the first UBM pad 134 and the first via 139. The solder bump height for the solder bumps 131 and 141 can be calculated with the assumption that post reflow the solder bump is approximately a portion of a sphere. Accordingly, based on the solder bump height and the perimeter length required per design, the solder volume can be calculated. The difference between the first via perimeter 139a and the first pad perimeter length 133a can be equal to the difference between the second via perimeter 149a and the second pad perimeter 143a based on the formula $\Delta d = 2\pi r \Delta r$, where d is the perimeter of a circle and r is the radius and the via and the pad are circular or an octagon approaching a circle.

Figure 2A:
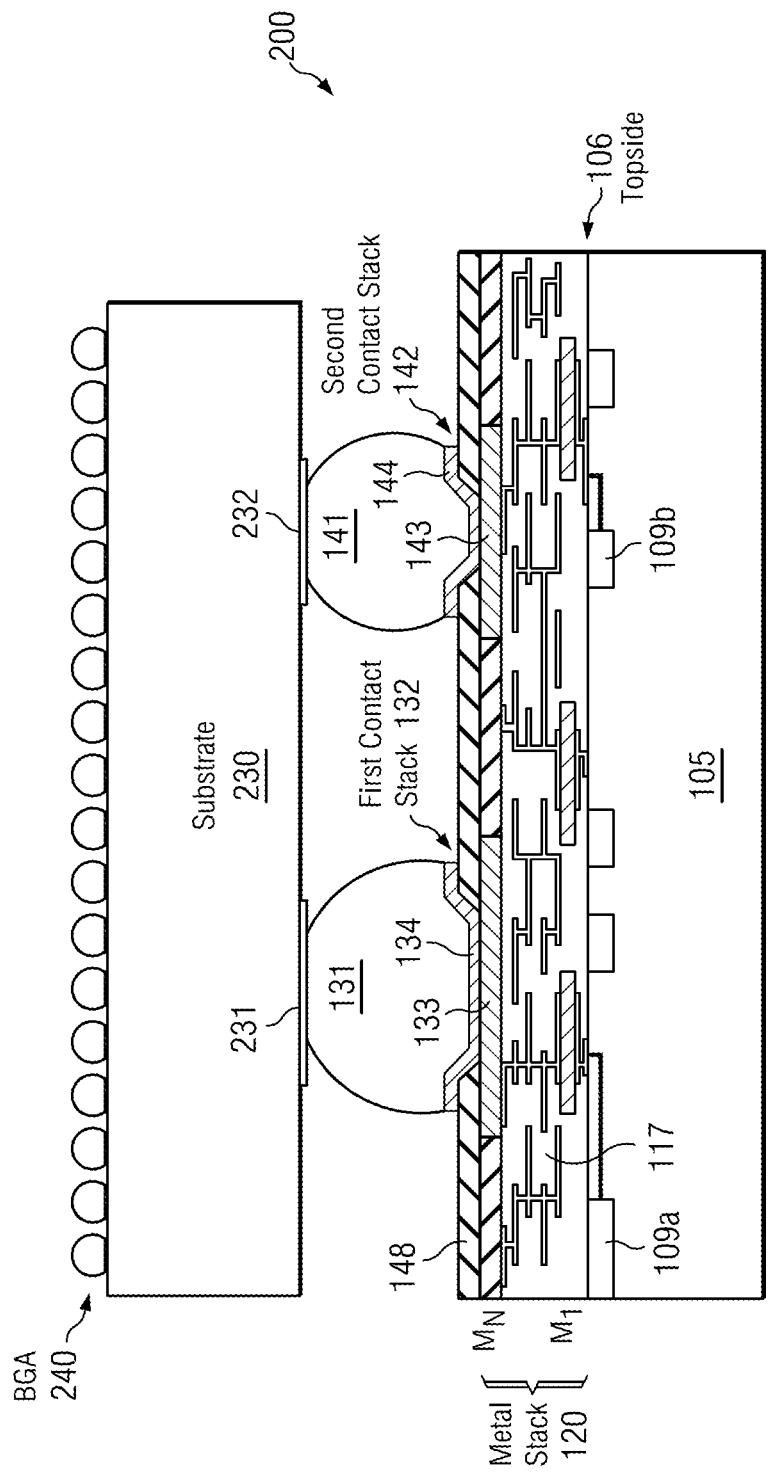
FIG. 2A is a cross sectional depiction of an electronic assembly including the semiconductor die shown in FIG. 1A bonded to a workpiece having a single level of land pads.
Figure 2B:
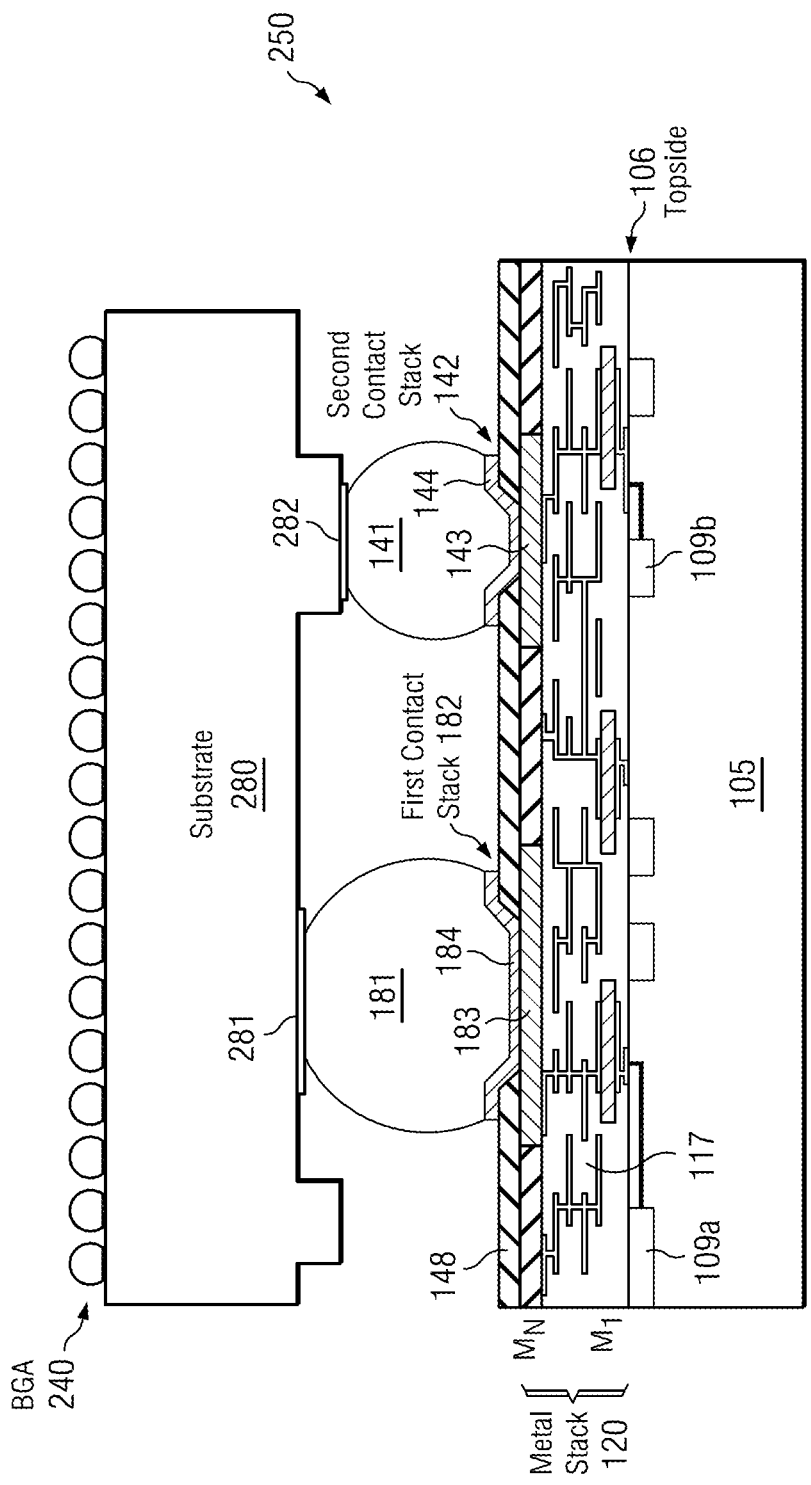
FIG. 2B is a cross sectional depiction of an electronic assembly including the semiconductor die shown in FIG. 1B bonded to a workpiece having a first level and a second level of land pads.

FIG. 2A is a cross sectional depiction of an electronic assembly 200 including the semiconductor die 100 shown in FIG. 1A bonded to a workpiece shown as substrate 230 that has a single level of land pads, including the land pads 231 and 232 shown. Substrate 230 being a single M1 substrate is generally a low cost substrate, such as a printed circuit cable (e.g., flexible printed cable). Substrate 230 can comprise a variety of other flexible substrates, for example in one particular embodiment a copper/polyimide flex substrate. As known in the art, flexible substrates allow non-destructive folding or bending to fit the available space or to allow relative movement.

The solder bumps 131 and 141 have the same height when measured from the topside surface 106 of the semiconductor die, with solder bump 131 having a larger diameter and thus a larger solder volume as compared to solder bump 141, such as in one embodiment 1.6 to 3.5 times bigger. Substrate 230 is also shown having a ball grid array (BGA 240) comprising a plurality of solder bumps. Disclosed substrates can also comprise flexible cable, printed circuit board (PCB), or a PCB having a BGA.

FIG. 2B is a cross sectional depiction of an electronic assembly 250 including the semiconductor die 150 shown in FIG. 1B bonded to a workpiece shown as substrate 280 having a first ML and a second ML of land pads, including a first land pad 282 on the first ML and a second land pad 281 on the second ML. The taller solder bump 181 has the proper height to properly reach to couple to the second land pad 281 on the second ML, while the shorter solder bump 141 is shown having the proper height to couple to first land pad 282 on the first ML. Although not shown, substrate 280 can include more than 2 MLs.

Figure 3:
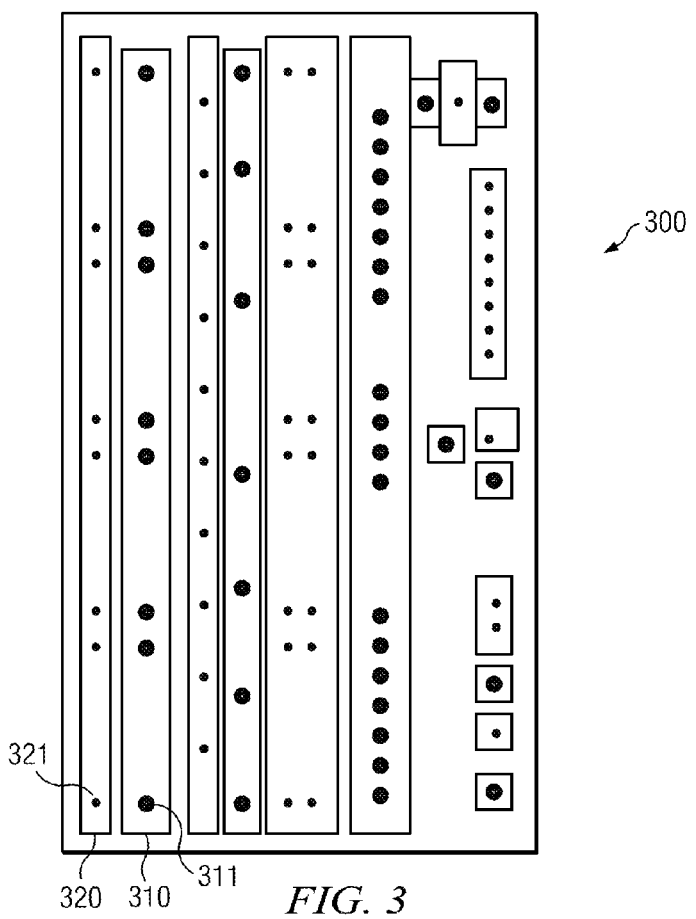
FIG. 3 is a depiction of an example bonding feature layout for a semiconductor die including regions having enlarged bonding feature dimensions including enlarged solder bumps, and smaller dimension bonding features including smaller size solder bumps, according to an example embodiment.

FIG. 3 is a depiction of an example bonding feature layout 300 for a semiconductor die including regions 310 having enlarged bonding features including enlarged solder bumps 311, and regions 320 having smaller bonding features including smaller size solder bumps 321, according to an example embodiment. As described above, disclosed larger size contact stacks including larger size solder bumps 311 can be used for power supply connections (e.g., VCC/VEE) and high current signal nodes to meet the EM requirement with less solder bumps, with the disclosed smaller size solder bumps 321 used for lower current handling signal connections, such as signal nodes. Layouts such as layout 300 effectively combines multiple small die pads that were necessary in conventional layouts to divide the current flowing to or from a single metal line for EM considerations into a larger pad, while other die pads (such as connected to signal nodes) on the semiconductor die are kept smaller, which can reduce the die size up to 40% in one embodiment.

It may also be important to consider die warpage/tilting during backend assembly and flip chip die reflow to a substrate 280. Disclosed enlarged bonding features including enlarged solder bumps 311 can also be applied for connections to some relatively low current nodes on the die to reduce die warpage/tilting, such as by placement of enlarged contact stacks including enlarged solder bumps 311 thereon (larger bump height and larger bump diameter) to provide a distribution of enlarged solder bumps that are spread substantially symmetrically within the semiconductor die. For example, it can be seen in layout 300 that there is at least one enlarged solder bump 311 corresponding to all four quadrants of the semiconductor die, where as described above the enlarged solder bumps 311 are on a disclosed first contact stack 132 (see FIG. 1A) or 182 (see FIG. 1B).

Disclosed embodiments provide several benefits. As disclosed above, the die size can be reduced while enabling reliable device performance and a reduction of die size (e.g., up to 40%) by combining multiple small die pads that were necessary to divide the current flowing to or from a single metal line for EM considerations into a larger pad, while other die pads (such as connected to signal nodes) on the semiconductor die are kept smaller. Embodiments such as semiconductor die 150 having dual bump height/diameter are configured for assembly to substrates having solder bumps that reside on 2 different planes of metal, such as a dual ML substrate having copper land pads on each of the MLs. Embodiments such as semiconductor die 100 having the same bump height with different bump diameters are configured for assembly to low cost single ML layer substrates.

Disclosed embodiments can be integrated into a variety of assembly flows to form a variety of different semiconductor IC devices and related products. The assembly can comprise single semiconductor die or multiple semiconductor die, such as PoP configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

I claim:
1. A semiconductor die, comprising
a metal stack including a top level metal having a plurality of die pads therein;
a passivation layer formed over said top level metal;
a first contact stack including:
 a first die pad from said plurality of die pads, said first die pad having a first pad perimeter;
 a first via through said passivation layer to said first die pad, said first via having a first via perimeter, and
 a first under bump metallization (UBM) pad contacting said first die pad through said first via having a first UBM pad perimeter and a first solder bump on said first UBM pad, said first solder bump having a bump diameter and a bump height sized to contact a first level of a multiple bonding level substrate, and a second contact stack, including:
  a second die pad from said plurality of die pads, said second die pad having a second pad perimeter shorter than said first pad perimeter;
  a second via through said passivation layer to said second die pad, said second via having a second via perimeter smaller than said first via perimeter, and
  a second UBM pad contacting said second die pad through said second via having a second UBM pad perimeter that is smaller than said first UBM pad perimeter and a second solder bump on said second UBM pad, said second solder bump having bump diameter and a bump height sized to contact a second level of said multiple bonding level substrate, wherein said semiconductor die is configured to pass a first current through a combination of said first die pad, said first via and said first UBM with a current density below a predetermined threshold current density per perimeter length at said first pad perimeter, at said first via perimeter and at said first UBM pad perimeter, wherein when said first current is passed through a combination of said second die pad, said second via and said second UBM said first current would have exceeded said predetermined threshold current density per perimeter length at said second pad perimeter, at said second via perimeter, and at said second UBM pad perimeter.

2. The semiconductor die of claim 1, wherein a power supply pin on said semiconductor die is coupled to said first contact stack, and wherein a signal pin on said semiconductor die is coupled to said second contact stack.

3. The semiconductor die of claim 1, wherein said first solder diameter is larger compared to said second solder bump diameter.

4. The semiconductor die of claim 1, wherein said semiconductor die comprises an integrated power semiconductor device.

5. An electronic assembly, comprising:
a multiple bonding level substrate having at least two metal levels (MLs) having land pads including a first land pad on a first bonding level and a second land pad on a second bonding level;
a semiconductor die, comprising
  a metal stack including a top level metal having a plurality of die pads therein;
  a passivation layer formed over said top level metal;
  a first contact stack including:
    a first die pad from said plurality of die pads, said first die pad having a first pad perimeter;
    a first via through said passivation layer to said first die pad, said first via having a first via perimeter, and
    a first under bump metallization (UBM) pad contacting said first die pad through said first via having a first UBM pad perimeter, and
  a second contact stack, including:
    a second die pad having a second pad perimeter shorter than said first pad perimeter;
    a second via through said passivation layer to said second die pad having a second via perimeter shorter than said first via perimeter;
    a second UBM pad contacting said second die pad through said second via having a second UBM pad perimeter that is shorter than said first UBM pad perimeter;
    and
    a first solder bump on said first UBM pad coupled to said first land pad and a second solder bump on said second UBM pad coupled to said second land pad, wherein said first solder bump has a larger bump diameter as compared to a bump diameter of said second solder bump, wherein said semiconductor die is configured to pass a first current through a combination of said first die pad, said first via and said first UBM with a current density below a predetermined threshold current density per perimeter length at said first pad perimeter, at said first via perimeter and at said first UBM pad perimeter, wherein when said first current is passed through a combination of said second die pad, said second via and said second UBM said first current would have exceeded said predetermined threshold current density per perimeter length at said second pad perimeter, at said second via perimeter, and at said second UBM pad perimeter.

6. The electronic assembly of claim 5, wherein a power supply pin on said semiconductor die is coupled by said first solder bump to said first land pad, and wherein a signal pin on said semiconductor die is coupled by said second solder bump to said second land pad.

7. The electronic assembly of claim 5, wherein said multiple bonding level substrate consists of a single metal layer ML that provides both said first and said second land pads.

8. The electronic assembly of claim 5, wherein said multiple bonding level substrate comprises a flexible substrate, a printed circuit board (PCB), or a PCB having a ball grid array (BGA).

9. The electronic assembly of claim 5, wherein said semiconductor die comprises an integrated power semiconductor device.

10. The electronic assembly of claim 5, wherein there is at least one of said first solder bump corresponding to all four quadrants of said semiconductor die.

* * * * *